US008021490B2

(12) United States Patent
Quillen et al.

(10) Patent No.: US 8,021,490 B2
(45) Date of Patent: Sep. 20, 2011

(54) SUBSTRATE CLEANING PROCESSES THROUGH THE USE OF SOLVENTS AND SYSTEMS

(75) Inventors: Michael W. Quillen, Kingsport, TN (US); L Palmer Holbrook, Kingsport, TN (US); John Cleaon Moore, Camarillo, CA (US)

(73) Assignee: Eastman Chemical Company, Kingsport, TN (US)

(*) Notice: Subject to any disclaimer, the term of this patent is extended or adjusted under 35 U.S.C. 154(b) by 0 days.

(21) Appl. No.: 11/649,600

(22) Filed: Jan. 4, 2007

(65) Prior Publication Data

US 2008/0163893 A1   Jul. 10, 2008

(51) Int. Cl.
    *C23G 5/02* (2006.01)
(52) U.S. Cl. .......... 134/2; 134/3; 134/26; 134/36; 134/42; 134/902
(58) Field of Classification Search ............. 134/2, 3, 134/26, 36, 42, 902
    See application file for complete search history.

(56) References Cited

U.S. PATENT DOCUMENTS

| | | | |
|---|---|---|---|
| 4,683,075 A | | 7/1987 | Wilson et al. |
| 4,746,397 A * | | 5/1988 | Maeda et al. .............. 216/90 |
| 4,983,490 A * | | 1/1991 | Durham .............. 430/169 |
| 5,302,212 A | | 4/1994 | Desbiendras et al. |
| 5,336,429 A | | 8/1994 | Barthélemy et al. |
| 5,458,800 A | | 10/1995 | Desbiendras et al. |
| 5,607,912 A | | 3/1997 | Samejima et al. |
| 5,630,904 A * | | 5/1997 | Aoyama et al. ........... 438/669 |
| 5,637,436 A | | 6/1997 | Johnson |
| 5,716,458 A | | 2/1998 | Machino |
| 5,773,403 A * | | 6/1998 | Hijino et al. ............. 510/411 |
| 5,972,862 A * | | 10/1999 | Torii et al. ............. 510/175 |
| 6,265,309 B1 * | | 7/2001 | Gotoh et al. ............. 438/637 |
| 6,399,562 B2 | | 6/2002 | Basile et al. |
| 6,401,361 B1 | | 6/2002 | Chen et al. |
| 6,432,622 B1 | | 8/2002 | Moon et al. |
| 6,462,005 B1 | | 10/2002 | Gotoh et al. |
| 6,486,078 B1 | | 11/2002 | Rangarajan et al. |
| 6,517,636 B1 | | 2/2003 | Verhaverbeke |
| 6,616,772 B2 | | 9/2003 | De Larios et al. |
| 6,638,694 B2 * | | 10/2003 | Ikemoto et al. ............. 430/331 |
| 6,689,734 B2 | | 2/2004 | Doyel et al. |
| 6,699,829 B2 | | 3/2004 | Doyel et al. |
| 6,737,225 B2 | | 5/2004 | Miller |
| 6,753,304 B1 | | 6/2004 | Barthelemy et al. |
| 6,764,551 B2 | | 7/2004 | Riggs et al. |
| 6,926,590 B1 | | 8/2005 | Chang et al. |
| 2002/0010116 A1 | | 1/2002 | Basile et al. |
| 2002/0037820 A1 * | | 3/2002 | Small et al. ............. 510/175 |
| 2003/0066542 A1 | | 4/2003 | Riggs et al. |
| 2003/0083220 A1 | | 5/2003 | Doyel et al. |
| 2003/0124462 A1 | | 7/2003 | Miller |
| 2003/0227005 A1 | | 12/2003 | Peterson et al. |
| 2003/0228997 A1 | | 12/2003 | Doyel et al. |
| 2004/0224870 A1 | | 11/2004 | Doyel et al. |
| 2006/0138399 A1 * | | 6/2006 | Itano et al. .............. 257/40 |
| 2008/0161217 A1 * | | 7/2008 | Zhang et al. ............ 510/176 |
| 2008/0163893 A1 * | | 7/2008 | Quillen et al. ............ 134/2 |

FOREIGN PATENT DOCUMENTS

| | | |
|---|---|---|
| EP | 0 389 087 A2 | 9/1990 |
| EP | 0 431 458 A1 | 6/1991 |
| EP | 0 875 926 A2 | 11/1998 |
| EP | 0 923 112 A1 | 6/1999 |
| EP | 1 016 699 A1 | 7/2000 |
| JP | 62050490 | 3/1987 |
| JP | 1139539 A | 6/1989 |
| JP | 1318092 A | 12/1989 |
| JP | 2200788 A | 8/1990 |
| JP | 2200789 A | 8/1990 |
| JP | 2202998 A | 8/1990 |
| JP | 3179097 A | 8/1991 |
| JP | 6179896 A | 6/1994 |
| JP | 6179897 A | 6/1994 |
| JP | 6184595 A | 7/1994 |
| JP | 6212193 A | 8/1994 |
| JP | 6293899 A | 10/1994 |
| JP | 07080423 * | 3/1995 |
| JP | 8151600 A | 6/1996 |
| JP | 11021187 | 1/1999 |
| JP | 11067703 | 3/1999 |
| JP | 1 1 212276 | 8/1999 |
| JP | 2005115373 | 4/2005 |
| JP | 2005338825 | 12/2005 |
| JP | 2006091238 | 4/2006 |
| WO | WO 94/14858 A1 | 7/1994 |
| WO | WO 02/04233 A1 | 1/2002 |
| WO | WO 2004/107057 A1 | 12/2004 |

OTHER PUBLICATIONS

Invitation to Pay Additional Fees dated Apr. 22, 2008 for corresponding PCT application.
Marra, J. and Huethorst, J.; "Physical Principles of Marangoni Drying"; Langmuir, vol. 7, p. 2748-2763, 1991.
International Technology Roadmap for Semiconductors (www.itrs.net).
Notification of Transmittal of the International Search Report and Written Opinion in PCT/US2007/026088 dated Aug. 18, 2008 Search Report cites references previously cited in IDS of Aug. 1, 2008.

* cited by examiner

*Primary Examiner* — Sharidan Carrillo
(74) *Attorney, Agent, or Firm* — Dennis V. Carmen; Bernard J. Graves, Jr.

(57) ABSTRACT

A method for removing common contaminates or residues which include but are not limited to ionic residues, particulate residues and moisture from semiconductor wafers used in the manufacture of IC (integrated circuits), liquid crystal displays and flat panel displays. The process includes the use of certain esters or certain esters combined with particular co-solvents. The cleaning method may be utilized in a variety of cleaning processes or process steps and offers economic and performance advantages.

14 Claims, No Drawings

SUBSTRATE CLEANING PROCESSES THROUGH THE USE OF SOLVENTS AND SYSTEMS

FIELD OF THE INVENTION

The present invention relates to the use of select solvents and/or solvent blends for semiconductor wafer cleaning and drying.

BACKGROUND OF THE INVENTION

As semiconductor devices are continuously scaled down, the wafer cleaning techniques have been diversified and increasingly significant. Particularly in a process for fabricating semiconductor devices having a fine structure, contaminants and particles attached to a cleaned wafer, static electricity, water marks, and linear particles have a great effect on subsequent processes.

In the fabrication of semiconductor devices, numerous processing steps, as many as several hundred, must be executed on a silicon wafer. These steps typically include (1) deposition of conductive and insulative layers on the silicon wafer substrate, (2) chemical or polishing process, and (3) application of a photoresist (4) mask such as titanium, oxide or silicon oxide, (5) lithographic or photolithographic techniques, (6) etching removing and stripping. Fabrication processes as those listed leave unwanted residual on the wafer surfaces. If left on the wafer, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is necessary to clean the wafer thoroughly yet efficiently after processing steps that leave unwanted residues. Since the processing of silicon wafers requires extreme cleanliness in the processing environment to minimize the presence of contaminating particles or films, the surface of the wafer is frequently cleaned after each processing step. After a wafer has been wet cleaned, it must be dried effectively to prevent water or cleaning fluid remnants for leaving residues on the wafer. If droplets of cleaning fluid form on the wafer surface, residue or contaminants previously dissolved in the cleaning fluid will remain on the wafer surface after evaporation forming spots. To prevent evaporation from taking place, the cleaning fluid must be removed as quickly as possible to prevent the formation of droplets on the wafer surface which subsequently interact with the base silicon, form oxides, and leave microscopic etched areas referred to as "water stains."

In an attempt to accomplish the cleaning and drying process without leaving contaminants, several drying techniques may be employed. Techniques currently utilized include spin drying, IPA (isopropyl alcohol) drying and Marangoni drying. It has been found the wafer cleaning by immersion or soaking of the wafer in deionized water (DI water); followed by drying of the wafer using IPA is effective in removing both particles and surface electrostatic charges from the wafer. See U.S. Pat. No. 6,926,590 B1. All of the drying techniques utilize some form of a moving liquid/gas interface on a wafer surface, which, if properly maintained, results in drying of a wafer surface without the formation of droplets. Unfortunately, if the moving liquid/gas interface breaks down, as often happens with all of the drying methods, droplets form and evaporation occurs resulting in contaminants being left on the wafer surface. See U.S. Pat. No. 6,616,772 B2.

In addition, these processes have difficulties with drying surfaces that are hydrophobic. Hydrophobic wafer surfaces can be difficult to dry because such surfaces repel water and water based (aqueous) cleaning solutions. Therefore, as the drying process continues and the wafer is pulled away from the cleaning fluid, the remaining cleaning fluid on the wafer (if aqueous based) will be repelled by the hydrophobic surface. As a result, the aqueous cleaning fluid will want the least amount of area to be in contact with the hydrophobic wafer surface. Additionally, the aqueous cleaning solution tends to cling to itself as a result of surface tension (i.e., as a result of molecular hydrogen bonding). Therefore, because of the hydrophobic interactions and the surface tension, droplets of aqueous cleaning fluid form in an uncontrolled manner on the hydrophobic wafer surface. This formation of droplets results in the harmful evaporation and the contamination previously discussed.

A typical wafer cleaning process consists of a DI water spray followed by a spin dry and nitrogen gas blow dry step. More recently, the solvent drying technology utilizes the use of isopropyl alcohol (IPA). The IPA vapor drying process is normally controlled by three major elements, i.e. the purity and water content of IPA; the flow rate and flow speed of the IPA vapor; and the cleanliness of the IPA vapor. The improved solvent drying technique in the past few years is Marangoni drying. In a Marangoni dryer, the drying principal is based on the different surface tension of IPA and DI water. The different surface tension causes the reduction of water molecules at the wafer surface. The Marangoni drying process is carried out by slowly withdrawing the wafer from a DI water tank. At the same time, IPA vapor carried by $N_2$ carrier gas is directed into the water chamber where IPA interacts at the water surface and diffuses into the water such that IPA is saturated on the exposed wafer surface above the water level. Since the concentration of IPA on the surface of the exposed wafer is larger than the concentration of DI water, the surface tension of IPA is reduced as compared to the surface tension of water in the water tank. This causes the water molecules on the surface of the exposed wafer to be retracted into the water tank and thus achieving the drying purpose. See U.S. Pat. No. 6,401,361 B1. The Marangoni drying process also prevents the formation of static electricity on the wafer, and thus, prevents the adherence of small charged particles to the wafer. As a result, the yield of IC devices fabricated on the wafer, as well as the performance of the devices, is enhanced.

As described in some of the examples above, referred to as surface finishing, many recognize these practices to achieve a level of art in semiconductor manufacturing relating to substrate texture and morphology. These practices may range from a deposition or removal process to cleaning. Such processes are conducted inside sophisticated tools/equipment designed for their precision to deliver and rinse ultrapure chemicals. Although such tools are ideal for control, they can be limited in their flexibility for new developments. To aid the screening of candidates for later testing on a tool, acceptable laboratory models are needed. This need is also stated by the ITRS in *Modeling and Simulation*, where demands are made for more predictive models for algorithms and simulation programs to allow larger problems to be tackled to include new materials and equipment. See International Technology Roadmap for Semiconductors.

Therefore, there is a need for products and methods allowing quick and efficient cleaning and drying of a semiconductor wafer, but at the same time reducing the formation of water or cleaning fluid droplets which may cause contamination to deposit on the wafer surface. New ways of developing and characterizing such products are also needed in order to accelerate their movement throughout an evaluation. The present invention focuses on the novel use of non-traditional semiconductor solvents to remove residual ionic, moisture, and particle contamination through the use of screening tests conducted with laboratory models.

BRIEF SUMMARY OF THE INVENTION

A first embodiment of the present invention concerns a method of solvent cleaning a semiconductor wafer using solvents comprising one or more esters selected from structures I, II, or III:

$R-CO_2R_1$ (I), $R_2-CO_2C_2H_4OC_2H_4-OR_3$ (II), $R_4OCO_2R_5$ (III); wherein R, $R_1$, $R_2$, $R_3$, $R_4$, and $R_5$ are independently selected from $C_1$-$C_8$-alkyl groups; optionally one or more cosolvents selected from water or compounds of structures IV, V, VI and VII:

$R_6OH$ (IV), $R_7OC_2H_4OC_2H_4OH$ (V), $R_8OC_2H_4OH$ (VI), and $R_9COR_{10}$ (VII); wherein $R_6$, $R_7$, $R_8$, $R_9$, and $R_{10}$ are independently selected from $C_1$-$C_8$-alkyl groups.

Another embodiment of the invention concerns a method of solvent cleaning a semiconductor wafer uses a specific ester of structure I as described above, wherein R and $R_1$ are independently selected from $C_1$-$C_2$ alkyl groups; optionally one or more cosolvents selected from water or compounds of structures IV, V, VI and VII as defined previously.

Another embodiment of the invention concerns a method of solvent cleaning a semiconductor wafer uses an ester or solvent blend of ester: cosolvent, wherein the ester portion comprises 0-100 weight percent of methyl acetate and the cosolvent portion comprises 0-100 weight percent and the cosolvent is selected from structures IV, V, VI and VII, wherein some ester portion is present. In other further embodiments, the ester portion comprises about 10, 20, 30, 40, 50, 60, 70, 80, or 90 weight percent of methyl acetate and the cosolvent portion comprises about 10, 20, 30, 40, 50, 60, 70, 80, or 90 weight percent. Also, the ester portion can comprise about 75 weight percent or greater while the cosolvent portion comprises about 25 weight percent or less.

Yet another embodiment of the invention concerns a method of solvent cleaning a semiconductor wafer uses an ester or solvent blend of ester: cosolvent, wherein the ester portion comprises 75-100 weight percent of methyl acetate and the cosolvent portion comprises 0-25 weight percent and the cosolvent is selected from structures IV, V, VI and VII.

Still a further embodiment of the invention concerns a method of solvent cleaning a semiconductor wafer uses solvents comprising one or more esters selected from structures I, II, or III:

$R-CO_2R_1$ (I), $R_2-CO_2C_2H_4OC_2H_4-OR_3$ (II), $R_4OCO_2R_5$ (III); wherein R, $R_1$, $R_2$, $R_3$, $R_4$, and $R_5$ are independently selected from $C_1$-$C_8$-alkyl groups; optionally one or more cosolvents selected from water or compounds of structures IV, V, VI and VII:

$R_6OH$ (IV), $R_7OC_2H_4OC_2H_4OH$ (V), $R_8OC_2H_4OH$ (VI), and $R_9COR_{10}$ (VII); wherein $R_6$, $R_7$, $R_8$, $R_9$, and $R_{10}$ are independently selected from $C_1$-$C_8$ alkyl groups; and one or more additional compounds selected from (1) sulfonic acid compounds having structure $R_{11}SO_3H$, wherein $R_{11}$ is selected from $C_1$-$C_{20}$-alkyl, $C_3$-$C_8$-cycloalkyl and aryl; (2) quaternary ammonium salts of structure $R_{12}$, $R_{13}$, $R_{14}$, $R_{15}$, NX, wherein $R_{12}$, $R_{13}$, $R_{14}$, $R_{15}$ independently represent $C_1$-$C_6$ alkyl groups optionally substituted with aryl groups and X is an anion selected from chloride, bromide, iodide, hydroxide, hydrogen sulfate and sulfate; (3) nonionic surfactant compound.

Another embodiment concerns a method for using solvent blends according to the embodiments described above for cleaning semiconductor wafers in typical immersion tool (wet bench) or other devices designed for cleaning and drying of semiconductor wafers.

DETAILED DESCRIPTION

This invention relates to the use of select solvents and/or solvent blends for semiconductor wafer cleaning and drying to more efficiently remove contaminants from wafer surfaces while offering economic and performance advantages by simplifying the manufacturing process and improving productivity. Contamination prevention has been explored with solvents such as isopropanol (IPA) as a means to model the effectiveness of drying and elimination of water spots [J. Marra and J. Huethorst, Langmuir, Vol. 7, p. 2748-2763 (1991)]. Wafer cleaning and drying has been observed to be enhanced by a surface-tension gradient at the interface through IPA vapor absorption. Solvent drying processes also prevent the formation of static electricity on the wafer, and thus, prevent the adherence of small charged particles to the wafer. The invention focuses on the novel use of non-traditional semiconductor solvents and their physical properties to remove residual ionic, moisture, and particle contamination through the use of screening tests conducted with laboratory models.

The invention introduces the use of esters such as methyl acetate and blends with cosolvents such as IPA, and additives to be used as an alternative to the use of IPA for cleaning, rinse and drying applications. Methyl acetate exhibits different physical properties to that of IPA which may contribute to these measured benefits. Although the laboratory models are based upon immersion conditions, the benefits identified should produce similar trends in a batch or single wafer spray condition, commonly practiced in a wafer cleaning tool used in semiconductor manufacturing. The fundamentals tested in a laboratory are expected to simulate the solvent properties and revert to the low contact angle and surface tension of the pure solvent and translate these benefits to the tools used in semiconductor manufacturing.

This invention also presents simple laboratory methods of modeling semiconductor cleaning applications. This data and the methods developed to model such cleaning applications in immersion conditions reveal the unique physical properties of esters and the cleaning benefit in moisture and ionic removal as well as particle cleaning from semiconductor substrates.

The following terms used in this description are more completely defined as follows:

The term $C_1$-$C_2$-alkyl is used to describe hydrocarbon groups containing one or two carbon atoms.

The term $C_1$-$C_6$-alkyl is used to describe hydrocarbon groups containing one to six carbon atoms, straight or branched chain, optionally substituted with aryl.

The term $C_1$-$C_8$-alkyl is used to describe hydrocarbon groups containing one to eight carbon atoms, straight or branched chain, optionally substituted with $C_1$-$C_8$-alkoxy, $C_1$-$C_8$-alkanoyloxy, or hydroxyl.

The term $C_1$-$C_{20}$-alkyl is used to describe hydrocarbon groups containing one to twenty carbon atoms, straight or branched chain, optionally substituted with $C_1$-$C_{20}$-alkoxy, $C_1$-$C_{20}$-alkanoyloxy, or hydroxyl.

The term $C_3$-$C_8$-cycloalkyl is used to describe cycloaliphatic hydrocarbon radical containing three to eight carbon atoms.

The term aryl is used to describe a phenyl or naphthyl radical optionally substituted with one or more $C_1$-$C_{20}$-alkyl groups.

The term $C_1$-$C_8$-alkoxy is used to describe a $R_{16}$—O— group, wherein the $C_1$-$C_8$-alkyl as previously defined.

The term $C_1$-$C_8$-alkanoyloxy is used to describe the group $R_{16}$—$CO_2$—, wherein $R_{16}$ represents a $C_1$-$C_8$-alkyl as previously defined.

The terms $C_1$-$C_{20}$-alkoxy and $C_1$ to $C_{20}$ alkanoyloxy represent structures $R_{17}$—O— and $R_{17}$—$CO_2$—, respectively, wherein $R_{17}$ is a $C_1$-$C_{20}$-alkyl group as previously defined.

The term nonionic surfactant is used to describe any surface tension modifying compounds, particularly including neutral ethoxylated organic compounds substituted with fluorine.

An embodiment of the present invention concerns a method for cleaning a semiconductor wafer. The method includes contacting the wafer with at least one solvent having, one or more esters selected from the group consisting of structures (I) R—$CO_2R_1$, (II) $R_2$—$CO_2C_2H_4OC_2H_4$—$OR_3$, and (III) $R_4OCO_2R_5$, wherein R, $R_1$, $R_2$, $R_3$, $R_4$, and $R_5$ are independently selected from $C_1$-$C_8$-alkyl groups, and optionally one or more cosolvent(s) selected from water and the group consisting of structure (IV) $R_6OH$, (V) $R_7OC_2H_4OC_2H_4OH$, (VI) $R_8OC_2H_4OH$, and (VII) $R_9COR_{10}$; wherein $R_6$, $R_7$, $R_8$, $R_9$, and $R_{10}$ are independently selected from $C_1$-$C_8$-alkyl groups.

In the above method, the solvent can include (I) R—$CO_2R_1$, wherein R and $R_1$ are independently selected from $C_1$-$C_2$ alkyl groups, and optionally one or more of said cosolvents. In one example, R and $R_1$ are both methyl.

Another embodiment includes contacting the wafer with an ester or a solvent blend of an ester and cosolvent, wherein the ester portion comprises about 0-100 weight percent of methyl acetate and the cosolvent portion includes about 0-100 weight percent and the cosolvent is selected from water and the group consisting of structure (IV) $R_6OH$, (V) $R_7OC_2H_4OC_2H_4OH$, (VI) $R_8OC_2H_4OH$, and (VII) $R_9COR_{10}$; wherein $R_6$, $R_7$, $R_8$, $R_9$, and $R_{10}$ are independently selected from $C_1$-$C_8$-alkyl groups, wherein some ester portion is present. In the ester/cosolvent blend, the ester portion is methyl acetate and can be about 10, 20, 30, 40, 50, 60, 70, 80, or 90 weight percent and the cosolvent portion can include about 10, 20, 30, 40, 50, 60, 70, 80, or 90 weight percent. Also, the ester portion is about 75 weight percent or greater while the cosolvent portion is about 25 weight percent or less.

Yet another embodiment includes contacting the wafer with an ester or a solvent blend of and ester and cosolvent, wherein the ester portion includes 75-100 weight percent of methyl acetate and the cosolvent portion includes 0-25 weight percent and the cosolvent is selected from water and the group consisting of structure (IV) $R_6OH$, (V) $R_7OC_2H_4OC_2H_4OH$, (VI) $R_8OC_2H_4OH$, and (VII) $R_9COR_{10}$; wherein $R_6$, $R_7$, $R_8$, $R_9$, and $R_{10}$ are independently selected from $C_1$-$C_8$-alkyl groups.

Another embodiment includes contacting the wafer with at least one solvent including one or more esters selected from the group consisting of structures (I) R—$CO_2R_1$, (II) $R_2$—$CO_2C_2H_4OC_2H_4$—$OR_3$, and (III) $R_4OCO_2R_5$; wherein R, $R_1$, $R_2$, $R_3$, $R_4$, and $R_5$ are independently selected from $C_1$-$C_8$-alkyl groups; and optionally one or more cosolvent(s) selected from water and the group consisting of structure (IV) $R_6OH$, (V) $R_7OC_2H_4OC_2H_4OH$, (VI) $R_8OC_2H_4OH$, and (VII) $R_9COR_{10}$; wherein $R_6$, $R_7$, $R_8$, $R_9$, and $R_{10}$ are independently selected from $C_1$-$C_8$-alkyl groups; and one or more additional compound(s) selected from the group consisting of (1) a sulfonic acid compound having structure $R_{11}SO_3H$, wherein $R_{11}$ is selected from $C_1$-$C_{20}$-alkyl, $C_3$-$C_8$-cycloalkyl and aryl; (2) a quaternary ammonium salt of structure $R_{12}$, $R_{13}$, $R_{14}$, $R_{15}$, NX, wherein $R_{12}$, $R_{13}$, $R_{14}$, $R_{15}$ independently represent $C_1$-$C_6$ alkyl groups optionally substituted with aryl groups and X is an anion selected from chloride, bromide, iodide, hydroxide, hydrogen sulfate and sulfate; and (3) a nonionic surfactant compound. In this embodiment, the additional compound is present in an amount of 0.001 to 1.0 weight percent.

A non-exhaustive list of solvents useful in the present invention includes methyl acetate, ethyl acetate, methyl propionate, iso-propyl acetate, n-propyl acetate, iso-butyl acetate, n-butyl acetate, ethyl propionate, n-butyl propionate, methyl iso-butyrate, n-butyrate, isobutyl isobutyrate, 2-ethylhexyl acetate, ethylene glycol butyl ether acetate, diethylene glycol ether acetate, diethylene glycol butyl acetate, propylene glycol methyl ether acetate, ethylene glycol propyl ether, ethylene glycol butyl ether, ethylene glycol 2 ethylhexyl ether, diethylene glycol methyl ether, diethylene glycol ethyl ether, diethylene glycol propyl ether, diethylene glycol butyl ether and propylene glycol methyl ether.

A non-exhaustive list of co-solvents useful in the presently described method includes methyl acetate, ethyl acetate, methyl propionate, iso-propyl acetate, n-propyl acetate, iso-butyl acetate, n-butyl acetate, ethyl propionate, n-butyl propionate, methyl iso-butyrate, n-butyrate, isobutyl isobutyrate, 2-ethylhexyl acetate, ethylene glycol butyl ether acetate, diethylene glycol ether acetate, diethylene glycol butyl acetate, propylene glycol methyl ether acetate, ethylene glycol propyl ether, ethylene glycol butyl ether, ethylene glycol 2 ethylhexyl ether, diethylene glycol methyl ether, diethylene glycol ethyl ether, diethylene glycol propyl ether, diethylene glycol butyl ether, propylene glycol methyl ether, water, acetone, methyl n-propyl ketone, methyl isobutyl ketone, methyl ethyl ketone, methyl iso-amyl ketone, diisobutyl ketone, methanol, isopropanol, n-propanol, isobutanol, sec-butanol, n-butanol, cyclohexanol, 2-ethyl hexanol and ethanol.

The presently described method can be used in known semiconductor cleaning system such as immersion tool (wet bath) systems and other devices used for cleaning and drying semiconductor wafers.

EXAMPLES

Materials

Silicon test wafers were procured from Montco Silicon Technologies, Inc., Spring City, Pa., and used as received. Throughout the experiments, wafers were recycled by using a surface pad washer with detergent solution. Porous substrates for moisture testing are inert micro- or nano-porous ceramic substrates composed of $SiO_2$, $Al_2O_3$, ZrO, and related materials stable to 1000° C. Two substrates are chosen having a pore size distribution of 300-800 nm (0.3-0.8 um) and 5-10 um, P/N PS500 & PS5 u, HP Technical Ceramics, Sheffield, United Kingdom (www.tech-ceramics.co.uk).

The Ionic material is ACS Reagent Grade potassium chloride (KCl, FW=74.55 g/M), prepared in a stock solution of approximately 0.0256 M=1% K (10 g/L as K)=10,000 ppm as K. Ionic method is tested over a range of dilutions to verify recovery down to 2 ppb at the point of measurement for a total wash volume of 100 ml, or 2.5 ng/$cm^2$ as K ion over the surface of a 100 mm wafer. The wafer application is by a unique spin-coating method described below. The particles used are silica-based derived from two sources, namely, 1) SPHERO™ silica particles, 0.4-0.6 um and 3.0-3.9 um sizing, PIN SIP-05-10 & SIP-30-10, Spherotech, Inc., Libertyville, Ill., and 2) Silica particles, 5 um, cat.#9005, Duke Scientific, Inc., Fremont, Calif. Stock solutions of each are dispersions of the said particles in a solvent matrix of methyl acetate/isopropyl alcohol between 1:1 to 1:3, depending upon the spin-coating program used.

The solvents used included isopropyl alcohol (IPA), acetone, methyl n-amyl ketone (MAK, CAS#110-43-0), ethylene glycol monopropyl ether (EP, CAS#2807-30-9), 2-(2-ethoxyethoxy) ethyl acetate (DEA, CAS#112-15-2), and 2-(2-butoxyethoxy)ethanol (DB, CAS#112-34-5), available from Eastman Chemical Company. Three (3) additives are used to include 1) an organic sulfonic acid as dodecylbenzenesulfonic acid (DDBSA, CAS#68484-22-5), Aldrich Chemical Company, 2) a surfactant of the nonionic fluorocarbon variety, P/N Zonyl™ FSO-100, DuPont, (www.dupont.com/zonyl), and 3) an organo-fluorine compound as tetrabutylammonium fluoride (TBAF, CAS#429-41-4), available from Sachem, Inc. (www.sacheminc.com). The additives noted here are used at 1,000 ppm.

Equipment

Ionics as K are analyzed by a Plasma Quad 3 (PQ3) ICP-MS. Particle dispersions are achieved using standard stir-bar mixing or enhanced with an ultrasonic @40 kHz transducer. Silicon 100 mm wafers are coated with KCl or particulate stock solution by spin-coating using a Brewer Science CB-100 coating system. Moisture is measured as % water using a standard Metrohm autotitrator that conducts a Karl Fischer (KF) iodimetric reaction monitored with a specialized electrode. Moisture is driven from the sample using a custom outgas cell designed for a wide temperature range with a nitrogen carrier gas. Units of ppm moisture are reported based upon an initial weight of the sample. Particle measurement is conducted in-situ on the wash liquid with a laser scattering equipment manufactured by *Particle Measuring Systems* (www.pmeasuring.com). Units of particles per ml are reported in distributive and cumulative formats based upon the size exclusion of the particle distribution taken down to 0.05 μm.

Methodology

Standard Ionic and particle specimens are coated individually onto wafers using a low rpm (revolution per minute) program to enhance volatility and maintain the total delivered amount on the wafer without edge loss. Using an auto-pipette set to 2000 μl=2.000 ml, the amount is delivered puddle and the CB100 program run at <300 rpm for 60 sec followed by a ramp to 500 rpm and completion at 1000 rpm. Once the coating is dried, the wafer is immersed into 100 ml of the test fluid (solvent) contained in a custom designed wafer wash vessel (WWV), then mildly agitated for 60 sec. This agitation, described as simple X-Y movement, is performed on every wafer in the entire experiment. The wafer is removed, drained of free-flowing liquid, and immediately sent into another WWV with 100 ml of the final wash with deionized water (DI), immersed for 60 sec using the identical agitation as was given in the prior test fluid, and removed to be set aside for wafer recycle. The final wash is collected, diluted to a specific volume (100 ml for ionics, 500 ml for particles). Particle analysis occurs within 48 hrs to minimize errors due to settling or bacteria formation.

Moisture testing occurs with the porous substrates. Although the porosity may be similar, each substrate is a different size. The weight of each substrate is known based upon earlier measurements when immediately removed from an oven. The substrates are allowed to become saturated by immersion into DI water for >2 hrs at room temperature. They are sent to a 20 ml vial filled with pure test fluid to be tested for 30 sec, immediately removed and follow with a short (<5 sec) dip into a second 20 ml vial containing fresh test fluid, towel dried, and sent to the outgas chamber of the KF set-up. The known weight for the specimen is entered while the system is equilibrated in a ready state and then the program is run. The chamber heats up at a given rate of approximately 10 C/min while $N_2$ is purging and carries outgas materials away where they are bubbled into the KF liquid, at the end of the outgas program, the back-titrates for free water and reports as ppm moisture. As indicated, low values for ppm moisture suggest high removal efficiency for the test fluid.

Results

To show the features and advantages of the present invention, data/examples are provided below in Tables 1-7. Each result will be explained in detail in Discussion of Results section.

TABLE 1

Ionic Removal by Solvents (measured as potassium ions, ppb)

| SOLVENT | RESIDUAL IONICS |
|---|---|
| Acetone (100%) | 165 |
| DB (100%) | 326 |
| DEA (100%) | 297 |
| EP (100%) | 267 |
| IPA (100%) | 251 |
| MA (100%) | 178 |
| MAK (100%) | 182 |

TABLE 2

Moisture Removal by Solvents (measured as ppm)

| SOLVENT | RESIDUAL MOISTURE |
|---|---|
| Acetone (100%) | 58 |
| DB (100%) | 22 |
| DEA (100%) | 5 |
| EP (100%) | 519 |
| IPA (100%) | 67 |
| MA (100%) | 52 |
| MAK (100%) | 995 |

TABLE 3

Ionic Removal by Solvent Blends (measured as potassium ions, ppb)

| SOLVENT BLENDS | RESIDUAL IONICS |
|---|---|
| MA/IPA, 25/75 weight % | 231 |
| MA/IPA, 50/50 weight % | 173 |
| MA/IPA, 75/25 weight % | 181 |

TABLE 4

Moisture Removal by Solvent Blends (measured as ppm)

| SOLVENT BLENDS | RESIDUAL MOISTURE |
|---|---|
| MA/IPA, 25/75 weight % | 218 |
| MA/IPA, 50/50 weight % | 133 |
| MA/IPA, 75/25 weight % | 45 |

TABLE 5

Ionic Removal by Pure Solvents with Additives (measured as potassium ions, ppb)

| SOLVENT, ADDITIVE | RESIDUAL IONICS |
|---|---|
| MA (100%) - Acid | 116 |
| MA (100%) - Surfactant | 101 |
| MA (100%) - Quaternary ammonium salt | 178 |
| IPA (100%) - Acid | 155 |
| IPA (100%) - Surfactant | 176 |
| IPA (100%) - Quaternary ammonium salt | 198 |

TABLE 6

Moisture Removal by Pure Solvents with Additives (measured as ppm)

| SOLVENT, ADDITIVE | RESIDUAL MOISTURE |
|---|---|
| MA (100%) - Acid | 70 |
| MA (100%) - Surfactant | 67 |
| MA (100%) - Quaternary ammonium salt | 87 |
| IPA (100%) - Acid | 25 |
| IPA (100%) - Surfactant | 78 |
| IPA (100%) - Quaternary ammonium salt | 113 |

TABLE 7

Particle Removal by Pure Solvents and Solvent Blends (measured as cumulative counts/mL, greater than or equal to 0.4 um)

| SOLVENT, SOLVENT ADDITIVE | RESIDUAL PARTICLES |
|---|---|
| MA (100%) | 4117 |
| IPA (100%) | 7074 |
| MA/IPA, 75/25 weight % | 2628 |
| MA/IPA, 75/25 weight %, Acid | 1177 |
| MA/IPA, 75/25 weight %, Surfactant | 2196 |

Discussion of Results

Results for the ionic removal of pure solvents are listed in Table 1. The ionic removal was determined by testing the wash residue for potassium (ppb) as previously described. Acetone, methyl acetate, and methyl amyl ketone suggest improved ionic removal over isopropyl alcohol under identical conditions.

Results for the moisture removal of pure solvent are listed in Table 2. The moisture removal was determined by testing the wash residue on the porous substrates for residual moisture (ppm). In terms of moisture, acetone and methyl acetate suggest mild improvements for removal capacity as compared to IPA under identical conditions. The use of DEA and DB appears to give improved results compared to IPA.

Combining the data from Table 1 and Table 2, methyl acetate suggests improvement over IPA in removing ionics and moisture by a measured benefit of nearly 30% and 20% respectively. This may be applied to surface cleaning applications such as those used in Marangoni style cleans. Methyl acetate exhibits different physical properties to that of IPA which may contribute to measured benefits. Being a surface sensitive practice, agents with low contact angle are expected to perform best. Literature suggests similar contact angle values for IPA and methyl acetate; however methyl acetate exhibits significantly greater density over IPA. Increase in density is believed to manifest itself as exhibiting enhanced momentum in a liquid as it streams across a semiconductor wafer surface. The use of methyl acetate during a highly active spray clean operation in a wafer cleaning tool would translate to a density-based momentum increase and provide improved results.

Table 3 shows ionic removal of methyl acetate/isopropyl alcohol blends measured as ppb. Again, the ionic removal was determined by testing the wash residue for potassium as previously described. Three compositions were evaluated, MA/IPA, 25/75 weight %, MA/IPA, 50/50 weight %, and a MA/IPA, 75/25 weight %. Data suggest improved ionic removal at the 50% and 75% methyl acetate composition levels.

Results for the moisture removal of methyl acetate/isopropyl alcohol blends are listed in Table 4. The moisture removal was determined by testing the wash residue on the porous substrates for residual moisture (ppm). Again, three compositions were evaluated, MA/IPA, 25/75 weight %, MA/IPA, 50/50 weight %, and a MA/IPA, 75/25 weight %. Data suggest improved moisture removal as the level of methyl acetate increased in the composition. The MA/IPA, 75/25 blend disclosed improvement over pure isopropyl alcohol and methyl acetate.

Reviewing the data from Table 3, a trend is shown of ionic removal vs. methyl acetate concentration. As methyl acetate increases from 25% to 75%, cleaning benefits increase from <10% to near 30% over IPA. This is consistent with our prior statement regarding materials with increase momentum (e.g., methyl acetate) to provide greater effects in surface cleaning. Reviewing the data from Table 4, the energy transfer through momentum may not be beneficial for moisture capture from porous substrates. Moisture capture is known to be governed by solubility. This phenomenon appears to be disrupted for mixtures of methyl acetate and IPA. Solutions rich in IPA were found to be antagonistic in their ability to capture moisture, while those rich in methyl acetate improved.

Table 5 discloses ionic removal of pure solvents with an additive, measured as ppb. Again, the ionic removal was determined by testing the wash residue for potassium as previously described. Methyl acetate and isopropyl alcohol were individually evaluated with an acid, surfactant and quaternary ammonium salt. The additives were included at 100 and 1000 ppm levels. Methyl acetate with a surfactant and acid shows greater than 50% improvement over pure isopropyl alcohol. This improvement is consistent with our previous statement about increased energy transfer by density based momentum in methyl acetate over IPA.

Table 6 discloses moisture removal of pure solvents with an additive. Again, the moisture removal was determined by testing the wash residue on the porous substrates for residual moisture (ppm). Methyl acetate and isopropyl alcohol were individually evaluated with an acid, surfactant and quaternary ammonium salt. The additives were included at 100 and 1000 ppm levels. Consistent with previous statements on moisture capture being governed by solubility, we find no benefit in trace additives to the pure solvent.

Experiments in removing particles are known to be surface sensitive similar to the ionic removal practices. Namely, similar surface adhesion principles may be at work with hydrophilic particles such as silicon dioxide as with ionic particles. Therefore, based upon prior results, those products known to be baseline and showing benefit for our invention were tested. As previously suggested, methyl acetate exhibits dissimilar physical properties when compared to IPA. For example, the higher density of methyl acetate and its polar/non-polar properties over IPA penetrate and interact with the van der Waals attraction between particles, and allow material to be released from the substrate and mix with the bulk chemistry. These interactions appear to be demonstrated with 100% methyl acetate, a MA/IPA 75/25 blend, and 75/25 MA/IPA blend with an acid and surfactant. Table 7 shows particle data results for these chemistries, measured as particle distribution in the cumulative mode. Sample results reveal a minimum of 40% and greater than 80% benefit in particle removal vs. IPA. Similar to ionic contamination, removal of particles is also believed to be governed by phenomenon described in our previous statement involving increased energy transfer by density based momentum increase.

In cases where methyl acetate or methyl acetate-blends and additives discussed here are applied to Marangoni type cleans, the chemistry's reduced water solubility (approximately 20%) and limited water concentration in an azeotrope (i.e. 5%) may force a quasi-emulsion to occur at the liquid-wafer surface. This emulsion would be expected to simulate the bulk solvent properties and revert to the low contact angle and surface tension of the pure solvent. Therefore, it is postulated that for low concentrations of methyl acetate or blends noted in this paper may concentrate at the surface of the DI wash fluid and force a heighted surface interaction to remove ionics, moisture, and particles, therefore providing a much cleaner wafer surface.

The invention has been described in detail with particular reference to preferred embodiments thereof, but it will be understood that variations and modifications can be effected within the spirit and scope of the invention.

We claim:

1. A method for drying a semiconductor wafer, consisting of:
    contacting a semiconductor wafer surface with a solvent consisting of (i) methyl acetate or (ii) a mixture of about 75/25 weight percent of methyl acetate and isopropyl alcohol to dry the semiconductor wafer by removing moisture from the semiconductor wafer surface.

2. The method according to claim 1, wherein the solvent is methyl acetate.

3. The method according to claim 1, wherein the solvent is a mixture of about 75/25 weight percent of methyl acetate and isopropyl alcohol.

4. A method for drying a semiconductor wafer, consisting of:
    contacting a semiconductor wafer surface with a solvent consisting of (i) methyl acetate, (ii) a mixture of about 50/50 weight percent of methyl acetate and isopropyl alcohol, or (iii) a mixture of about 75/25 weight percent of methyl acetate and isopropyl alcohol to dry the semiconductor wafer by removing moisture from the semiconductor wafer surface.

5. The method according to claim 4, wherein the solvent is methyl acetate.

6. The method according to claim 4, wherein the solvent is a mixture of about 50/50 weight percent of methyl acetate and isopropyl alcohol.

7. The method according to claim 4, wherein the solvent is a mixture of about 75/25 weight percent of methyl acetate and isopropyl alcohol.

8. A method for cleaning a semiconductor wafer, consisting of:
    contacting a semiconductor wafer surface with a solvent consisting of: (i) methyl acetate or (ii) a mixture of about 75/25 weight percent of methyl acetate and isopropyl alcohol to clean the semiconductor wafer by removing particle contamination from the semiconductor wafer surface.

9. The method according to claim 8, wherein the solvent is methyl acetate.

10. The method according to claim 8, wherein the solvent is a mixture of about 75/25 weight percent of methyl acetate and isopropyl alcohol.

11. A method for drying a semiconductor wafer, consisting of:
    contacting a semiconductor wafer surface with a solvent consisting of (i) methyl acetate or (ii) a mixture of about 75/25 weight percent of methyl acetate and isopropyl alcohol, and (iii) at least one compound selected from the group consisting of:
        (a) a sulfonic acid compound having structure $R_{11}SO_3H$, wherein $R_{11}$ is selected from $C_1$-$C_{20}$-alkyl, $C_3$-$C_8$-cycloalkyl, and aryl;
        (b) a quaternary ammonium salt having structure $R_{12}$, $R_{13}$, $R_{14}$, $R_{15}$, NX, wherein $R_{12}$, $R_{13}$, $R_{14}$, and $R_{15}$ independently represent $C_1$-$C_6$ alkyl groups optionally substituted with aryl groups and X is an anion selected from chloride, bromide, iodide, hydroxide, hydrogen sulfate, and sulfate; and
        (c) a nonionic surfactant compound;
    to dry the semiconductor wafer by removing moisture from the semiconductor wafer surface.

12. A method for cleaning a semiconductor wafer, consisting of:
    contacting a semiconductor wafer surface with a solvent consisting of (i) methyl acetate, (ii) a mixture of about 50/50 weight percent of methyl acetate and isopropyl alcohol, or (iii) a mixture of about 75/25 weight percent of methyl acetate and isopropyl alcohol, and (iii) at least one compound selected from the group consisting of:
        (a) a sulfonic acid compound having structure $R_{11}SO_3H$, wherein $R_{11}$ is selected from $C_1$-$C_{20}$-alkyl, $C_3$-$C_8$-cycloalkyl, and aryl;
        (b) a quaternary ammonium salt having structure $R_{12}$, $R_{13}$, $R_{14}$, $R_{15}$, NX, wherein $R_{12}$, $R_{13}$, $R_{14}$, and $R_{15}$ independently represent $C_1$-$C_6$ alkyl groups optionally substituted with aryl groups and X is an anion selected from chloride, bromide, iodide, hydroxide, hydrogen sulfate, and sulfate; and
        (c) a nonionic surfactant compound;
    to clean the semiconductor wafer by removing residual ionic contamination from the semiconductor wafer surface.

13. A method for cleaning a semiconductor wafer, consisting of:
    contacting a semiconductor wafer surface with a solvent consisting of: (i) methyl acetate or (ii) a mixture of about 75/25 weight percent of methyl acetate and isopropyl alcohol, and (iii) at least one compound selected from the group consisting of:
        (a) a sulfonic acid compound having structure $R_{11}SO_3H$, wherein $R_{11}$ is selected from $C_1$-$C_{20}$-alkyl, $C_3$-$C_8$-cycloalkyl, and aryl;
        (b) a quaternary ammonium salt having structure $R_{12}$, $R_{13}$, $R_{14}$, $R_{15}$, NX, wherein $R_{12}$, $R_{13}$, $R_{14}$, and $R_{15}$ independently represent $C_1$-$C_6$ alkyl groups optionally substituted with aryl groups and X is an anion selected from chloride, bromide, iodide, hydroxide, hydrogen sulfate, and sulfate; and
        (c) a nonionic surfactant compound;
    to clean the semiconductor wafer by removing particle contamination from the semiconductor wafer surface.

14. The method according to any one of claims 11, 12, or 13, wherein the at least one compound is present in an amount of 0.001 to 1.0 weight percent.

* * * * *